United States Patent

Maldonado et al.

[11] Patent Number: 5,168,513
[45] Date of Patent: Dec. 1, 1992

[54] X-RAY METROLOGY AND ALIGNMENT DETECTION SYSTEM

[75] Inventors: Juan R. Maldonado; Yuli Vladimirsky, both of Chappaqua, N.Y.

[73] Assignee: International Business Machines Corporation, Armok, N.Y.

[21] Appl. No.: 775,880

[22] Filed: Oct. 11, 1991

[51] Int. Cl.$^5$ .............................................. G21K 5/00
[52] U.S. Cl. ...................................... 378/34; 378/205
[58] Field of Search ................................. 378/34, 205

[56] References Cited

U.S. PATENT DOCUMENTS

| | | | |
|---|---|---|---|
| 3,984,680 | 10/1976 | Smith . | |
| 4,016,416 | 4/1977 | Shepherd, Jr. | 250/211 J |
| 4,037,969 | 7/1977 | Feldman et al. | 356/172 |
| 4,539,695 | 9/1985 | La Fiandra | 378/34 |
| 4,614,433 | 9/1986 | Feldman et al. | 356/401 |
| 4,636,080 | 6/1987 | Feldman | 356/401 |
| 4,698,834 | 10/1987 | Northrup et al. | 378/34 |
| 4,798,470 | 6/1989 | Moriyama et al. | 356/401 |
| 4,904,087 | 2/1990 | Harvey et al. | 356/400 |
| 4,945,551 | 7/1990 | Makabe et al. | 378/34 |
| 5,074,667 | 12/1991 | Miyatake | 378/34 |

Primary Examiner—Craig E. Church
Attorney, Agent, or Firm—Graham S. Jones, II

[57] ABSTRACT

This is a process for aligning an x-ray lithography system including an x-ray mask and a work piece with an alignment mark. A zone plate lens is used in the x-ray mask. X-rays are directed through the zone plate lens to the alignment mark to detect when the lens is aligned with the mark by emission of photoelectrons generated by the work piece in response to the x-rays. The change of current when the x-ray beam crosses a feature on the alignment mark is detected by a properly biased zone plate or grating. The alignment mark can be an etched slot or a metal feature.

6 Claims, 1 Drawing Sheet

X-RAY METROLOGY AND ALIGNMENT DETECTION SYSTEM

BACKGROUND OF THE INVENTION

1. Field of the Invention

This invention relates to x-ray lithography and metrology systems, and more particularly to alignment or detection systems for that purpose.

2. Description of related art.

In lithography, it is known to employ visible light to perform measurements in alignment systems. However, when measurements are to be made in x-ray technology, the limits of conventional optical measurements are exceeded. These limits are in general, caused by the fact that systems using visible optics are less accurate than is required because of wavelength limitations.

U.S. Pat. No. 4,016,416 of Shepherd et al, for "Phase Compensated Zone Plate Photodector" shows a zone plate with a photodetector mounted on the opposite face.

U.S. Pat. No. 3,984,680 of Smith for "Soft X-Ray Mask Alignment System" shows an x-ray mask alignment system with x-ray fluorescence detectors mounted on the mask which measure the x-ray fluorescent signal which provides a low intensity output as compared with an electron flux.

U.S. Pat. No. 4,614,433 of Feldman for "Mask-to-Wafer Alignment Utilizing Zone Plates" shows mask to wafer alignment using zone plates illuminated by light during alignment.

In accordance with this invention, a method and apparatus is provided for aligning an x-ray lithography system including an x-ray mask and a work piece with an alignment mark, including the steps as follows:

a) including means on the x-ray mask for focussing the x-ray beam on the work piece such as a zone plate or grating, b) directing x-rays through the means for focussing at the alignment mark for detecting when the lens or grating is aligned with the mark by emission of photoelectrons generated by the work piece in response to the x-rays and detecting the change of current when the x-ray beam crosses a feature on the alignment mark.

Preferably the alignment mark comprises an etched slot or a metal feature.

Further in accordance with this invention, an apparatus and a method are provided to improve the detection capabilities of a metrology system for measuring a work piece in connection with a plurality of fiducial marks forming an array on the work piece, comprising a) providing an x-ray source, b) providing a means for focussing such as a zone plate lens or a grating on an x-ray transparent substrate, c) directing x-rays through the zone plate lens to a first one of the fiducial marks for detecting when the lens or grating is aligned with the mark by emission of photoelectrons generated by the work piece in response to the x-rays and detecting the change of current when the x-ray beam crosses a feature on the first one of the fiducial marks, d) a laser interferometrically controlled table that determines the position between two of the fiducial marks in the array of marks. previously defined on the work piece.

DESCRIPTION OF THE PREFERRED EMBODIMENT

Figure 1:
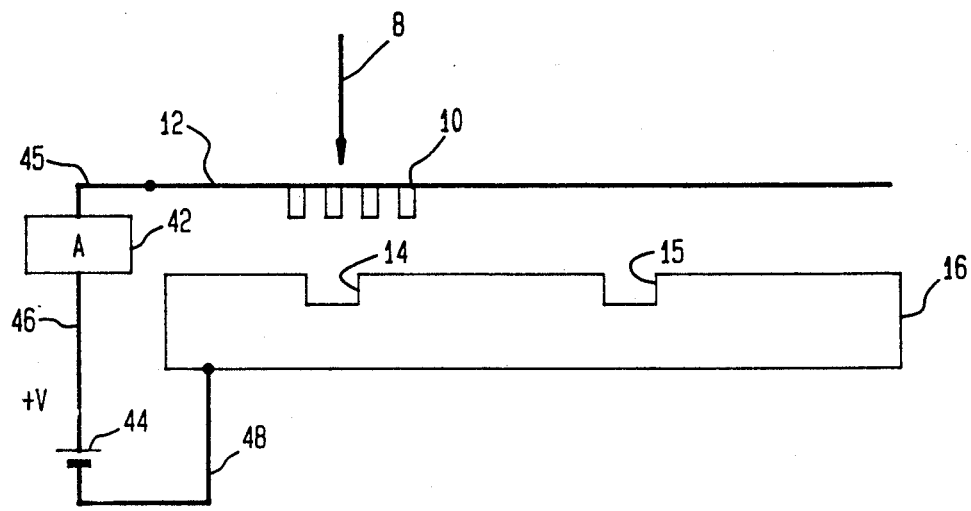
FIG. 1 shows in schematic an x-ray alignment system in accordance with this invention.

This alignment system is suitable for x-ray lithography applications. The system, shown in FIG. 1, includes a source 8 of x-rays, an x-ray focusing element 10 which also functions as a photoelectron detector (i.e., electrically conductive zone plate lens 10 or a grating) located on a very thin membrane comprising x-ray mask 12. The zone plate 10 is connected by electrically conductive lines not shown for convenience of illustration on the surface of mask 12 to a line 45 to ammeter 42 to line 46 to positive terminal of battery 44 to line 48 to the back side of a substrate 16. The voltage from battery 44 is applied to the zone plate 10 to collect electrons photoemitted by the mark 14 on the substrate 16. An alignment mark 14 located on the lithographic substrate 16 (typically a Si wafer) is illuminated by the focused x-rays from the zone plate lens 10 on mask 12. The mask/substrate gap 20 is the distance between the bottom of the mask 12 and the top surface of the substrate 16. The alignment mark 14 may be formed by etching a relatively deep and narrow feature at an appropriate place on the lithographic substrate 16, which with a semiconductor wafer 16 forms an etched mark 14 on the wafer 16.

The photoelectrons developed on the lithographic substrate 16 by the impinging x-ray beam 8 are detected by the properly biased electrically conductive zone plate 10 located on the mask 12. The x-ray beam 8 reaching the zone plate 10 may be scanned with an appropriate mirror, or the mask 12 and wafer 16 may be oscillated with respect to each other.

The resulting photoelectric current from the alignment mark 14 is expected to change as the edge of the etched slot on the alignment mark 14 is reached by the x-ray beam 8, and also to decrease as the x-ray beam is scanned inside the etched slot. Therefore, alignment between mask 12 and wafer 16 is performed by detecting the signal obtained by scanning the x-ray beam 8 around the alignment mark 14. The detection can be performed with the same properly biased zone plate.

In another embodiment of the invention, the alignment mark 14 on the wafer 16 consists of a metal frame. The alignment signal peaks at the centroid of the alignment mark 14 from any other layers deposited during processing in order to maximize the signal-to-background ratio.

In an x-ray system operating in a helium atmosphere between mask and wafer, the photoelectric signal will be amplified by the secondary electrons produced by the ionization of the helium gas. Therefore, the system appears to be ideally suited for operation in a helium environment.

Preferably, the photoelectrons are detected by the zone plate which is metallic and is connected to the appropriate measuring circuit.

Figure 2:
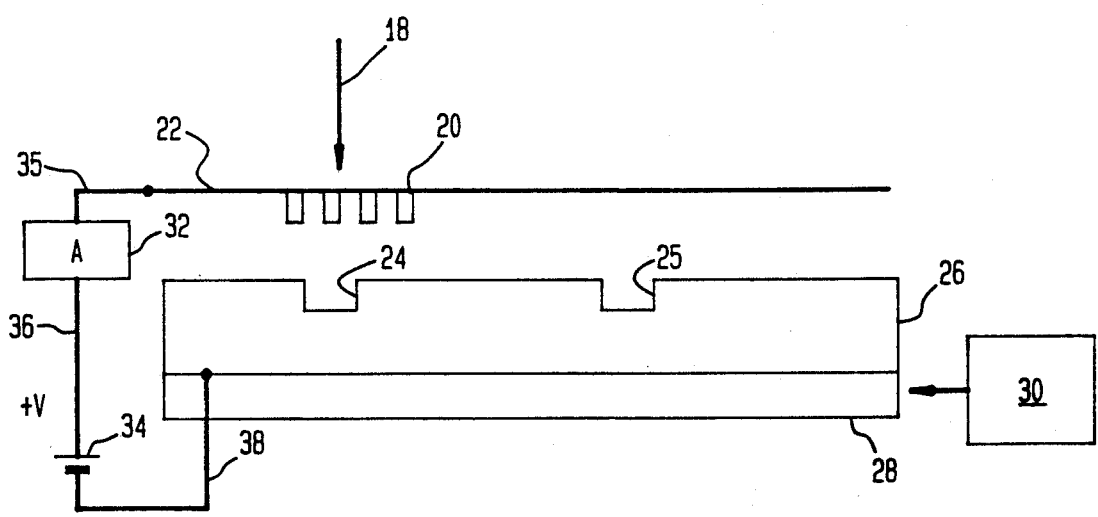
FIG. 2 illustrates in schematic form a method and apparatus for improving the fiducial mark detection capabilities of a metrology system with x ray detection.

FIG. 2 illustrates another aspect of this invention.

An x-ray beam 18 is directed at a a zone plate lens 20 (or a grating) on an x-ray transparent substrate 22, which is similar to the mask of FIG. 1, and the beam is focussed by the zone plate lens 20 on a fiducial mark 24 on the top of a work piece 26 for detecting when the lens 20 is aligned with the mark 24 by emission of photoelectrons generated by the work piece 26 in response to the x-rays. A detection circuit is provided for detecting the change of current when the x-ray beam crosses a feature on the fiducial mark 24. The detection circuit includes the zone plate 20, electrically conductive lines not shown in convenience of illustration on the surface of mask 12 to a line 35 to ammeter 32 to line 36 to positive terminal of battery 34 to line 38 to the back side of work piece 28. The voltage from battery 34 is applied to the zone plate 20 to collect electrons photoemitted by the mark 24 on the work piece 26.

A laser interferometer 30 controls movable x, y table 28 that determines the position between two fiducial marks 24 and 25 in an array of marks previously defined on the work pieces 26 to be measured.

While a battery has been shown as the source of biasing potential in FIGS. 1 and 2 it will be obvious to those skilled in the art that other AC (pulsed) and DC sources or energy can be employed to energize the circuit.

What is claimed is:

1. Apparatus for detection of alignment of an x-ray lithography system including an x-ray mask and a work piece with an alignment mark, comprising:
    a) an x-ray beam, means on said x-ray mask for focussing said x-ray beam on said work piece,
    b) (1) means for directing x-rays through said means for focussing at said alignment mark, (2) means for detecting when said means for focussing is aligned with the mark by emission of photoelectrons generated by the work piece in response to said x-rays and detecting a change of current when the x-ray beam crosses a feature on said alignment mark.

2. Apparatus in accordance with claim 1 wherein said alignment mark comprises an etched slot.

3. Apparatus in accordance with claim 1 wherein said alignment mark comprises a metal feature.

4. A method for detection of alignment of an x-ray lithography system including an x-ray mask and a work piece with an alignment mark, including the steps as follows:
    a) including means on said x-ray mask for focussing an x-ray beam on said work piece,
    (b) directing x-rays through said means for focussing at said alignment mark for detecting when said means for focussing is aligned with said mark by emission of photoelectrons generated by said work piece in response to said x-rays and detecting a change of current when said x-ray beam crosses a feature on said alignment mark.

5. A method in accordance with claim 4 wherein said alignment mark comprises a metal feature.

6. A method in accordance with claim 4 wherein said alignment mark comprises an etched slot.

* * * * *